United States Patent
Pfeuffer (10) Patent No.: US 9,865,784 B2
(45) Date of Patent: Jan. 9, 2018

(54) OPTOELECTRONIC COMPONENT INCLUDING A REFLECTIVE LAYER SEQUENCE AND METHOD FOR PRODUCING A REFLECTIVE LAYER SEQUENCE

(71) Applicant: OSRAM Opto Semiconductors GmbH, Regensburg (DE)

(72) Inventor: Alexander Pfeuffer, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/117,739

(22) PCT Filed: Feb. 9, 2015

(86) PCT No.: PCT/EP2015/052660
§ 371 (c)(1),
(2) Date: Aug. 10, 2016

(87) PCT Pub. No.: WO2015/121205
PCT Pub. Date: Aug. 20, 2015

(65) Prior Publication Data
US 2017/0012187 A1    Jan. 12, 2017

(30) Foreign Application Priority Data
Feb. 11, 2014   (DE) .................. 10 2014 202 424

(51) Int. Cl.
*H01L 33/44*   (2010.01)
*H01L 33/60*   (2010.01)
(Continued)

(52) U.S. Cl.
CPC .......... *H01L 33/60* (2013.01); *H01L 33/0079* (2013.01); *H01L 33/405* (2013.01);
(Continued)

(58) Field of Classification Search
CPC ....... H01L 33/60; H01L 33/405; H01L 33/42; H01L 33/46; H01L 2933/0025; H01L 2933/0058; H01L 2933/0016; H01L 33/44
See application file for complete search history.

(56) References Cited

U.S. PATENT DOCUMENTS 3,984,176 A * 10/1976 Hirai ................. G02B 5/124
349/65
2002/0008815 A1 * 1/2002 Hanakawa ........ G02F 1/133553
349/113
(Continued)

FOREIGN PATENT DOCUMENTS

DE    102010024079 A1    12/2011
DE    102010036269 A1    3/2012
(Continued)

OTHER PUBLICATIONS

German Search Report based on Application No. 10 2014 202 424.2 (4 Pages) dated Dec. 9, 2014 (Reference Purpose Only).
(Continued)

*Primary Examiner* — Mary Wilczewski
(74) *Attorney, Agent, or Firm* — Viering, Jentschura & PartnermbB (57) ABSTRACT

An optoelectronic component includes a first layer sequence being designed to emit or to detect electromagnetic radiation, and a second layer sequence being arranged at a first side of the first layer sequence and designed to reflect the electromagnetic radiation emitted or to be detected by the first layer sequence. The second layer sequence has a first reflector layer, a second reflector layer and an adhesion promoting layer. The first reflector layer contains a first material and is arranged at a first side of the second layer sequence facing the first side of the first layer sequence, the adhesion promoting layer contains a second material and is arranged at a second side of the second layer sequence (Continued)

facing away from the first side of the first layer sequence, and the second reflector layer contains the first material and is arranged between the first reflector layer and the adhesion promoting layer.

12 Claims, 6 Drawing Sheets

(51) Int. Cl.
*H01L 33/00* (2010.01)
*H01L 33/40* (2010.01)

(52) U.S. Cl.
CPC ...... *H01L 33/44* (2013.01); *H01L 2933/0016* (2013.01); *H01L 2933/0058* (2013.01); *Y02E 10/52* (2013.01)

(56) References Cited

U.S. PATENT DOCUMENTS

| | | | |
|---|---|---|---|
| 2009/0251646 A1* | 10/2009 | Yoo | G02F 1/133555 349/106 |
| 2010/0065869 A1 | 3/2010 | Arai et al. | |
| 2010/0289040 A1 | 11/2010 | Seo et al. | |
| 2011/0188125 A1* | 8/2011 | Takenaka | G02B 5/124 359/634 |
| 2011/0303934 A1* | 12/2011 | Kang | H01L 33/405 257/98 |
| 2013/0140598 A1 | 6/2013 | Hoeppel et al. | |
| 2013/0146910 A1 | 6/2013 | Maute et al. | |
| 2013/0214292 A1* | 8/2013 | Kazama | H01L 33/02 257/79 |
| 2013/0221390 A1 | 8/2013 | Engl et al. | |
| 2014/0339584 A1* | 11/2014 | Kim | C09K 11/0883 257/98 |
| 2015/0115301 A1* | 4/2015 | Yang | H01L 33/405 257/98 |
| 2015/0155456 A1* | 6/2015 | Kuramoto | H01L 33/46 257/98 |
| 2015/0249196 A1* | 9/2015 | Williams | H01L 33/62 257/88 |
| 2015/0316233 A1* | 11/2015 | Kawamata | F21V 7/22 362/317 |
| 2016/0018692 A1* | 1/2016 | Park | G02F 1/133615 349/58 |
| 2016/0163923 A1* | 6/2016 | Kuo | H01L 33/405 257/98 |
| 2016/0240732 A1* | 8/2016 | Huang | H01L 33/382 |
| 2016/0263865 A1* | 9/2016 | Park | B32B 17/10018 |
| 2016/0333459 A1* | 11/2016 | Thuo | C23C 14/165 |
| 2016/0365496 A1* | 12/2016 | Kuo | H01L 33/405 |
| 2017/0012187 A1* | 1/2017 | Pfeuffer | H01L 33/44 |
| 2017/0102135 A1* | 4/2017 | Kawamata | F21V 29/502 |

FOREIGN PATENT DOCUMENTS

| | | |
|---|---|---|
| WO | 2006131087 A1 | 12/2006 |
| WO | 2011107344 A1 | 9/2011 |

OTHER PUBLICATIONS

International Search Report based on Application No. PCT/EP2015/052660 (4 Pages) dated May 12, 2015 (Reference Purpose Only).

* cited by examiner

OPTOELECTRONIC COMPONENT INCLUDING A REFLECTIVE LAYER SEQUENCE AND METHOD FOR PRODUCING A REFLECTIVE LAYER SEQUENCE

RELATED APPLICATIONS

The present application is a national stage entry according to 35 U.S.C. §371 of PCT application No.: PCT/EP2015/052660 filed on Feb. 9, 2015, which claims priority from German application Nos.: 10 2014 202 424.2 filed on Feb. 11, 2014, and is incorporated herein by reference in its entirety.

TECHNICAL FIELD

Various embodiments relate to an optoelectronic component in which a reflective layer sequence is arranged in order to reflect emitted electromagnetic radiation or electromagnetic radiation to be detected. Furthermore, a method for producing a reflective layer sequence for an optoelectronic component is described.

BACKGROUND

Optoelectronic components often contain reflective structures in order to increase the efficiency of the optoelectronic component. By way of example, electromagnetic radiation emitted by an active layer of the component in the direction of an opaque carrier can be deflected by the reflective structure in a desired emission direction of the optoelectronic component.

In order to reflect the greatest possible proportion of the electromagnetic radiation, the reflective structures are often shaped from materials which have a high reflectance for the wavelength range of the electromagnetic radiation that is emitted or to be detected by the optoelectronic component. In this case, there is generally the problem that some materials having particularly good reflective properties, such as silver or gold, for example, wet the semiconductor material of the optoelectronic component only poorly. Furthermore, the reflective materials may have only a low adhesion on the semiconductor material. Although the adhesion of the reflective structure to the semiconductor material of the optoelectronic component can be improved by heat treatment processes, material defects, such as holes or cracks, for example, can arise in the reflective structure as a result. Such material defects—referred to hereinafter as holes for simplification—can adversely affect the quality and/or the function of the reflective structure. This applies particularly to holes that completely penetrate through the reflective structure in the vertical direction, that is to say parallel to the growth direction of the layer sequence.

Consequently, one object is to prevent or at least limit the formation of holes in the reflective structure. In particular, the intention is to provide an optoelectronic component without holes in the reflective structure that adversely affect the function and/or the quality. Furthermore, the intention is to specify a method for producing a corresponding optoelectronic component.

SUMMARY

In order to achieve said object, an optoelectronic component including a first layer sequence and a second layer sequence is proposed. The first layer sequence is designed to emit or to detect electromagnetic radiation. The second layer sequence is arranged at a first side of the first layer sequence and designed to reflect the electromagnetic radiation emitted or to be detected by the first layer sequence. The second layer sequence has a first reflector layer, a second reflector layer and an adhesion promoting layer. The first reflector layer contains a first material and is arranged at a first side of the second layer sequence facing the first side of the first layer sequence. The adhesion promoting layer contains a second material and is arranged at a second side of the second layer sequence facing away from the first side of the first layer sequence. The second reflector layer contains the first material and is arranged between the first reflector layer and the adhesion promoting layer.

The provision of separate reflector layers can prevent or at least limit the formation of holes in the second layer sequence. In this regard, it was possible to observe, for example, that the formation of holes often ends at the interface between the reflector layers. This may be accounted for by the fact that the interface between the reflector layers constitutes a barrier for the holes propagating through the reflector layer. In an individual reflector layer, by contrast, even if its layer thickness substantially corresponds to the sum of the layer thicknesses of the two separate reflector layers, the formation of holes can take place substantially unimpeded in the vertical direction.

By virtue of the formation of holes being prevented or at least limited, the quality of the reflector layers can be increased. One aspect of a higher quality may consist for example in a high reflectivity. A further aspect may consist in the reflector layers being nontransmissive in total. By way of example, the reflector layers nontransmissive in total can serve as a barrier for a structuring method provided in the production of the component. In this regard, the reflector layers nontransmissive in total can be provided for example as a barrier for wet-chemical etching processes. A further aspect may consist in an improved electrical transverse conductivity resulting from the limited formation of holes.

In order to achieve the object, a method for producing a layer sequence of an optoelectronic component is furthermore proposed. The layer sequence has a first reflector layer containing a first material, a second reflector layer containing the first material, and an adhesion promoting layer containing a second material. In the method for producing the layer sequence, a horizontal grain boundary region is produced between the application of the first material for the first reflector layer and the application of the first material for the second reflector layer at least in one of the reflector layers.

The horizontal grain boundary region can be produced for example by a growth pause in the course of producing the reflector layers, by a material removal during the production of the reflector layers and/or by the introduction of an intermediate layer. The horizontal grain boundary region produced forms a barrier within the reflector layers and thus counteracts the formation of holes. Accordingly, the quality of the reflector layers can be increased by the stated measures.

The second layer sequence can have a third reflector layer. The provision of three separate reflector layers makes it possible to impede the formation of holes through a further interface between the reflector layers.

The third reflector layer can contain the first material. The first, second and third reflector layers can have substantially the same layer thickness. The total layer thickness of the reflector layers of the second layer sequence can be less than 500 nm. By way of example, the total layer thickness of the reflector layers can be between 400 nm and 200 nm. Furthermore, the first, the second and the optional third reflector layer can substantially be formed from the same material. By way of example, the reflector layers can contain at least 80% of the first material. In some exemplary embodiments, the reflector layers can contain at least 95% of the first material. The first material may include for example silver, gold, aluminum, rhodium or a compound containing these materials.

The adhesion promoting layer can be designed to increase the adhesion of the reflector layer on a semiconductor material of the first layer sequence. The second material may include for example zinc oxide, platinum, nickel, titanium, indium tin oxide or a compound containing these materials. Particularly if the first material includes gold or silver, the second material may also include aluminum or rhodium. The adhesion promoting layer can be arranged directly at one of the reflector layers.

The layer thickness of the adhesion promoting layer can be between 5 nm and 100 nm. In some exemplary embodiments, the layer thickness of the adhesion promoting layer can be between 20 nm and 70 nm. Furthermore, the layer thickness of the adhesion promoting layer can be between 40 nm and 60 nm.

The adhesion promoting layer can form a diffusion barrier. This may be the case for example if the second material, alongside the adhesion promoting properties, also prevents a diffusion of material into the reflective layers. An adhesion promoting layer acting as a diffusion barrier can be shaped in a continuous fashion. By way of example, the adhesion promoting layer can be arranged in a continuous fashion between the reflector layer and a further layer of the optoelectronic component. In some embodiments, the further layer can be provided for example for electrically contacting one of the layers of the first layer sequence. Electrically conductive structures arranged vertically in the component can be provided which are designed to electrically conductively connect the further layer and a semiconductor layer of the first layer sequence. The adhesion promoting layer can be arranged such that there is no direct contact between the reflector layer and the further layer and/or the vertical electrically conductive structures. Accordingly, the adhesion promoting layer can continuously cover the sidewalls and/or parts of the sidewalls of the at least two reflector layers.

In one embodiment, zinc oxide is provided as material for the adhesion promoting layer. An adhesion promoting layer shaped from zinc oxide can prevent a diffusion of material from the further layer through the adhesion promoting layer into the reflector layers. Accordingly, an adhesion promoting layer formed from zinc oxide can form a diffusion barrier.

The second layer sequence can have an intermediate layer arranged between the reflector layers. In comparison with the reflector layer, the intermediate layer can be relatively thin. By way of example, the layer thickness of the intermediate layer can be a maximum of 10% of the layer thickness of one of the reflector layers. In this regard, the intermediate layer can have a layer thickness of less than or equal to 10 nm. Furthermore, the intermediate layer can have a layer thickness of less than or equal to 5 nm. In some exemplary embodiments, the intermediate layer can have a layer thickness of 3 nm. The intermediate layer can be a continuous structure or a structure having local openings. By way of example, a layer that completely covers a reflector layer can be referred to as a continuous structure. By way of example, a layer in which the intermediate layer, for example owing to the small layer thickness, does not completely cover the reflector layer can be referred to as a structure having local openings. The structure having local openings can have material accumulations arranged in a distributed fashion, for example. Furthermore, the intermediate layer can be intercalated between the reflector layers.

The intermediate layer can contain the second material and/or a third material. The third material can be selected for example from the same material group as the second material. Consequently, the third material may include for example zinc oxide, platinum, nickel, titanium, indium tin oxide, rhodium, chromium or a compound containing these materials. The intermediate layer can be electrically conductive. By way of example, the intermediate layer can contain a doped semiconductor material. In one exemplary embodiment, doped zinc oxide can be provided as material for the intermediate layer. By way of example, the electrical conductivity of zinc oxide can be increased by a doping with aluminum or gallium.

The reflector layers can each have horizontal grain boundary regions.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The term "optoelectronic component" can encompass for example components which are designed to emit electromagnetic radiation and/or to detect electromagnetic radiation. The proposed solution is explained below on the basis of the example of a light emitting diode (LED), wherein the features explained for an LED may also be provided in other optoelectronic components.

Figure 1:
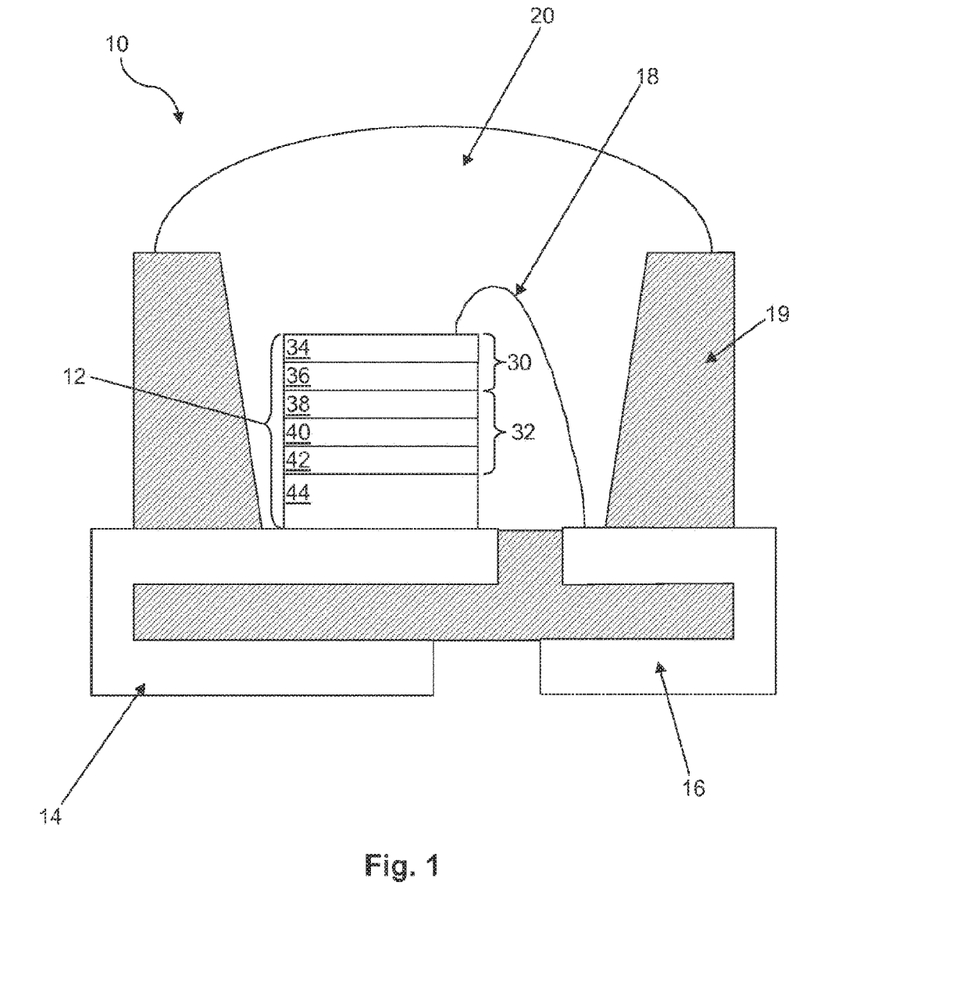
FIG. 1 shows a schematic illustration of a cross section of an optoelectronic component.

FIG. 1 shows a schematic illustration of a cross section through a first embodiment of an optoelectronic component 10. The illustration in FIG. 1 is provided in particular for schematic elucidation.

The component illustrated in FIG. 1 may be an LED, for example. The component 10 includes a chip 12, a first connection contact 14 and a second connection contact 16. The first and second connection contacts 14, 16 are designed to mechanically and electrically connect the component 10 to other components, such as a printed circuit board, for example. The chip 12 is arranged by one of its side surfaces on the first connection contact 14 and is electrically conductively connected to the second connection contact 16 by means of a bonding connection 18. Furthermore, the component 10 includes a structure element 19. The structure element 19 can be shaped from an electrically insulating plastic, for example. The structure element 19 is designed to mechanically connect the elements of the component 10, such as the first and second connection contacts 14, 16, for example. Furthermore, the component 10 includes a coupling-out element 20. The coupling-out element 20 is designed to couple out the electromagnetic radiation emitted by the component 10. A lens-shaped coupling-out element 20 is provided in the embodiment illustrated in FIG. 1.

The chip 12 illustrated in FIG. 1 includes a first layer sequence 30, a second layer sequence 32 and a carrier 44. The carrier 44 can be applied for example by means of a solder layer on the first connection contact 14 of the component. The second layer sequence 32 is arranged on that side of the carrier 44 which faces away from the first connection contact 14. The first layer sequence 30 is arranged on that side of the second layer sequence 32 which faces away from the carrier 44. By way of example, semiconductor materials can be provided as material for the carrier 44. The chip 12 can contain a multiplicity of further layers or structures. To facilitate understanding, these are not illustrated in the schematic illustration in FIG. 1.

Figure 2A:
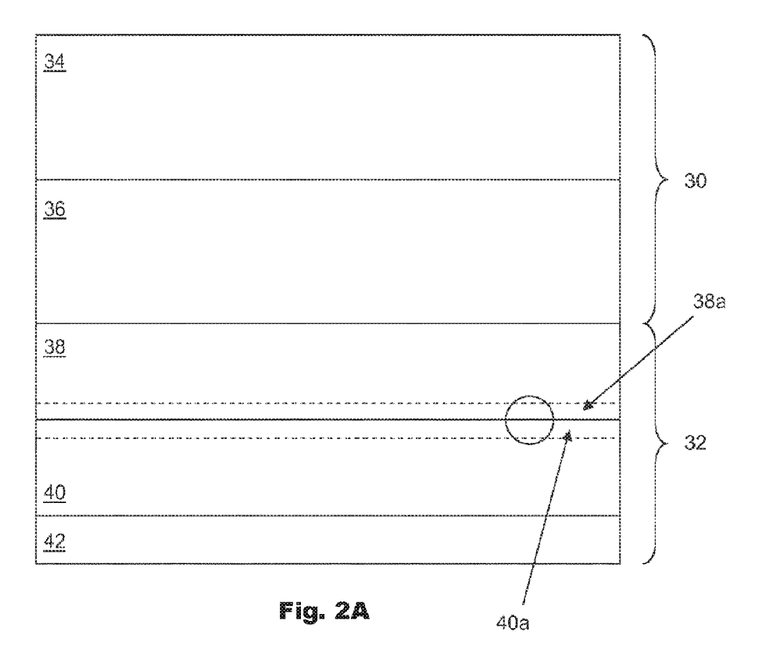
FIG. 2A shows a schematic illustration of a cross section through layer sequences in accordance with a first embodiment.

Further features of the first and second layer sequences 30, 32 are explained in association with FIG. 2A. FIG. 2A is a schematic illustration of a cross section through the first and second layer sequences 30, 32. The layers of the first and second layer sequences 30, 32, which layers are illustrated as vertically stacked planar structures for simplification in FIG. 2A, can have significantly more complex shapes in real components. By way of example, in the layer sequence vertically arranged electrically conductive structures and associated electrically insulating structures can be arranged which are provided for electrically conductively connecting layers arranged spaced apart.

The first layer sequence 30 includes at least two layers. In the embodiment illustrated in FIG. 2A, an n-doped semiconductor layer 34 and a p-doped semiconductor layer 36 are provided. In this case, the n-doped semiconductor layer 34 forms the surface of the first layer sequence 30 and thus of the chip 12 illustrated in FIG. 1. The p-doped semiconductor layer 36 is arranged in the layer sequence below the n-doped semiconductor layer 34. The n-doped semiconductor layer 34 and the p-doped semiconductor layer 36 can be formed from III-V semiconductor materials, for example. A nitridic compound semiconductor material such as gallium nitride, for example, can be provided. Alongside nitridic compound semiconductor material, a compound semiconductor material based on InGaAlP or gallium arsenide can furthermore also be provided.

The first layer sequence 30 is designed to emit electromagnetic radiation. The electromagnetic radiation emitted by the first layer sequence 30 is intended to be emitted substantially via the surface of the first layer sequence 30, that is to say the surface of the n-doped semiconductor layer 34. The first layer sequence 30 is delimited toward the second layer sequence 32 by the first side of the first layer sequence 30. In the illustration in FIG. 2A, the underside of the p-doped semiconductor layer 36 forms the first side of the first layer sequence 30.

The second layer sequence 32 is arranged at the first side of the first layer sequence 30. The second layer sequence 32 can be arranged, in the manner as illustrated for example in FIG. 2A, directly at the p-doped semiconductor layer 36. The second layer sequence 32 includes a first reflector layer 38, a second reflector layer 40 and an adhesion promoting layer 42. The first reflector layer 38 is arranged directly at the first side of the first layer sequence 30. In the illustration in FIG. 2A, the top side of the first reflector layer 38 forms the first side of the second layer sequence 32. In the illustration in FIG. 2A, the second reflector layer 40 is arranged below the first reflector layer 38. The first and second reflector layers 38, 40 in each case contain a first material. In each case contain a first material can mean here that for example the proportion by weight of the first material in the first and second reflector layers 38, 40 is in each case more than 80%. Furthermore, the first and second reflector layers 38, 40 can be formed substantially from the same material. Formed substantially from the same material can mean for example that the proportion by weight of the first material in the first and second reflector layers 38, 40 is in each case more than 95%. In some exemplary embodiments, the first and second reflector layers 38, 40 can be formed completely from the same material. The first material may include for example silver, gold, aluminum, rhodium or a compound containing these materials.

Even if the first and second reflector layers 38, 40 directly adjoin one another and contain substantially the same material, nevertheless the first and second reflector layers 38, 40 are mutually separate layers. Indications that separate layers are involved are, for example, the horizontal grain boundary regions 38a, 40a respectively arranged at the interface between the reflector layers 38, 40. In this regard, the first reflector layer 38 has a horizontal grain boundary region 38a at its side facing the second reflector layer 40. The second reflector layer 40 has a horizontal grain boundary region 40a at its side facing the first reflector layer 38.

Figure 2B:
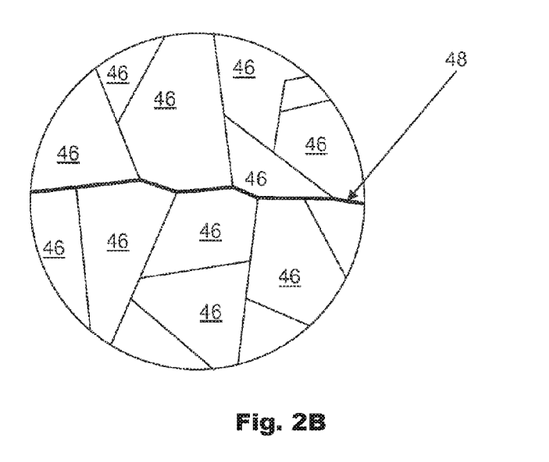
FIG. 2B shows a schematic illustration of an enlarged excerpt from FIG. 2A.

In the horizontal grain boundary regions 38a, 40a, the grain structures 46 of the first material that otherwise appear substantially disordered form the discernible superordinate structure of the interface 48. This is illustrated schematically in the excerpt in FIG. 2B. The interface 48 of the reflector layer is composed of the substantially horizontally running sections of the grain boundaries of the respective grains. In this regard, as illustrated for example in FIG. 2B, said sections need not run exactly horizontally. Accordingly, the interface 48 can also have irregularities and deviations from a planar shape.

An adhesion promoting layer 42 is arranged on that side of the second layer sequence 32 which faces away from the first layer sequence 30. The adhesion promoting layer 42 contains a second material. The second material may include for example zinc oxide, platinum, nickel, titanium, indium tin oxide or a compound containing these materials. If the reflector layers contain silver or gold, the second material may also include aluminum or rhodium. Contains a second material can mean, for example, that the proportion by weight of the second material in the adhesion promoting layer 42 is more than 80%. The adhesion promoting layer 42 is provided in order to increase the quality of the reflector layers. The properties of the material of the adhesion promoting layer 42 can influence the properties of the material of the reflector layers 38, 40 to the effect that the layer quality of the reflector layer 38 arranged directly at the semiconductor material of the first layer sequence 30 is increased. The adhesion promoting layer 42 is designed to increase the adhesion of the first and/or second reflector layer(s) 38, 40 on the semiconductor material of the first layer sequence 30. For improving the layer quality of the reflector layers 38, 40, it is not necessary for the second material to be arranged between the semiconductor material of the first layer sequence and the reflector layers. Rather, it can be observed that an adhesion promoting layer 42 arranged at the side of the second layer sequence 32 facing away from the first side of the first layer sequence 30 increases the layer quality of the reflector layers.

In addition, the adhesion promoting layer 42 can be designed to form a diffusion barrier. An adhesion promoting layer acting as a diffusion barrier can be provided, for example, in order to prevent or at least to limit diffusion into the semiconductor layers of the first layer sequence 30 and/or into the reflector layers 38, 40. An adhesion promoting layer 42 provided as a diffusion barrier can completely cover the adjoining reflector layers. Particularly if the reflector layers do not extend over the entire basic area, that is to say if the reflector layers are structured, the adhesion promoting layer 42 can also cover the side surfaces of the reflector layers. By way of example, an adhesion promoting layer 42 as a diffusion barrier can be designed to separate the reflector layers 38, 40 from electrically conductive structures extending vertically through the first and second reflector layers 38, 40.

In an embodiment that is not illustrated, the reflector layers can be structured laterally differently. By way of example, the first reflector layer can have a larger area than the second reflector layer. The different areas can result for example from the reflector layers being structured using different masks. Side surfaces of the second reflector layer can be recessed in comparison with the side surfaces of the first reflector layer, wherein the first and second reflector layers form a step. The different areas of the reflector layers make it possible to produce a more expedient aspect ratio for subsequent shaping over the reflector layers.

The first and second reflector layers 38, 40 can have in total a layer thickness of less than 500 nm. By way of example, the sum of the layer thicknesses of the reflector layers can be 200 nm to 400 nm. Furthermore, the first and second reflector layers 38, 40 can have substantially the same layer thickness. By way of example, the first and second reflector layers 38, 40 can be in each case silver layers having a layer thickness of approximately 150 nm. In the embodiments illustrated, the adhesion promoting layer 42 can be a zinc oxide layer having a layer thickness of approximately 50 nm. Generally, the layer thickness of the adhesion promoting layer 42 can be in a range of 5 nm to 100 nm. In further embodiments, the layer thickness of the adhesion promoting layer 42 can be in a range of 20 nm to 70 nm.

In the course of producing the second layer sequence, between the application of the first reflector layer 38 and the application of the second reflector layer 40 a growth pause and/or a removal of already applied material of the reflector layer can be provided. During the growth pause and/or as a result of the material removal, horizontal grain boundaries can form in the reflector layer or the material is removed as far as a grain boundary already formed. If the material for the next reflector layer is applied after the growth pause or after the material removal, the applied material deposits at the already existing grain boundaries of the already applied reflector layer. Accordingly, a horizontal grain boundary region forms in this reflector layer, too.

The first material for the first reflector layer 38 can be applied directly to a layer of the first layer sequence for example by sputtering or vapor deposition. In the embodiment illustrated, approximately 150 nm of silver are applied directly to the p-doped semiconductor layer 36 by sputtering. After the first reflector layer 38 has been applied with the desired layer thickness, a growth pause is provided. For the growth pause, by way of example, the sputtering process can be interrupted for a specific time interval. By way of example, a growth pause of at least ten seconds can be provided, during which no material is applied. After the growth pause, the sputtering process is then continued for the second reflector layer 40. For the application of the second reflector layer 40, the same parameters as or similar parameters to those for the application of the first reflector layer 38 can be provided. The first and second reflector layers 38, 40 can be applied in the same installation. The component to be produced can remain in the installation during the growth pause. Furthermore, the reflector layers can also be applied with different process parameters in order to produce a horizontal grain boundary region between the reflector layers. By way of example, the pressure in the process chamber, the power of the installation and/or the electrical bias voltage of the substrate can be altered.

A material removal provided for producing the horizontal grain boundary regions can be effected by backsputtering, for example. The backsputtering can be carried out in the same installation as the sputtering; in this case, the polarity of the electrodes of the installation is reversed. By way of example, a silver layer for the first reflector layer 38 with a layer thickness of approximately 160 nm can be applied directly to the p-doped semiconductor layer 36. The polarity of the sputtering installation is then reversed and 10 nm of the applied first reflector layer 38 are removed again. After the backsputtering, the first reflector layer 38 has a layer thickness of approximately 150 nm. After the layer thickness provided for the first reflector layer 38 has been attained, the polarity of the electrodes of the installation can be reversed again. A growth pause can be provided in addition to reversing the polarity of the electrodes. Afterward, the first material for the second reflector layer 40 can be applied.

After the second reflector layer 40 has been applied, the second material for the adhesion promoting layer 42 is applied. The second material can be applied to the second reflector layer 40 by sputtering or vapor deposition, for example. A structuring of the reflector layers 38, 40 can be provided before the application of the adhesion promoting layer 42.

After the application of the adhesion promoting layer 42, a thermal treatment can be provided. By way of example, the layer sequences can be subjected to heat treatment. For the heat treatment, the layer sequences can be stored for one hour at temperatures of between 200° C. and 300° C. After the heat treatment, further processing steps for the production of the optoelectronic component can be provided. By way of example, wet-chemical structuring methods for structuring the first layer sequence can be provided, in which methods the reflector layers 38, 40 serve as a barrier.

Figure 3:
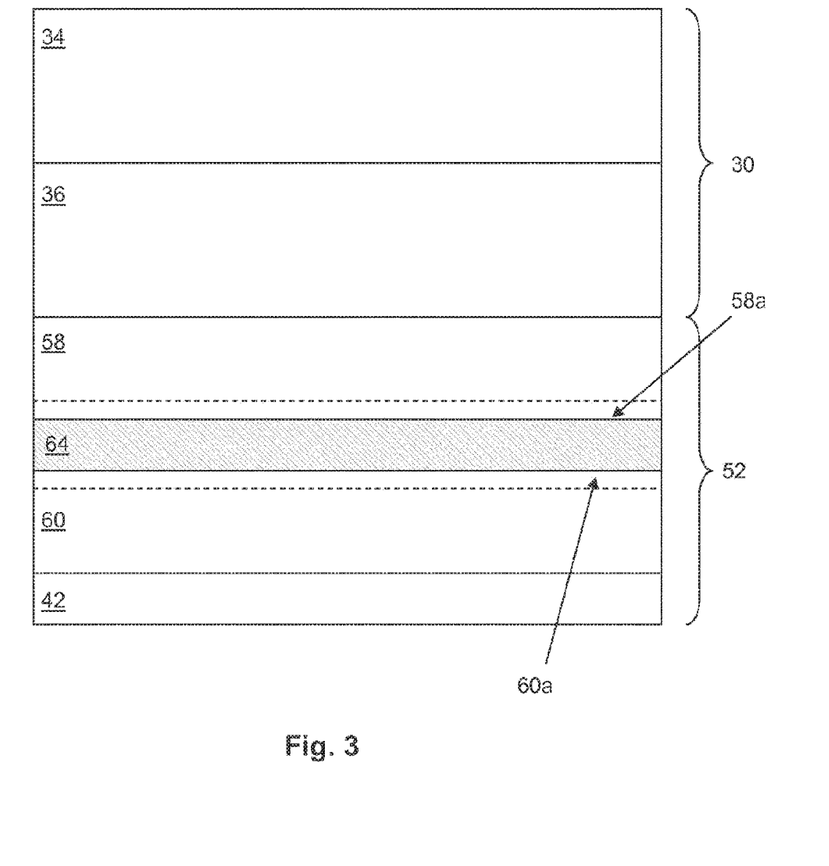
FIG. 3 shows a schematic illustration of a cross section through layer sequences in accordance with a second embodiment.

FIG. 3 is a schematic illustration of a cross section through a first and second layer sequence 30, 52 in accordance with a second embodiment. The subject matter of the second embodiment is based on the subject matter of the first embodiment, wherein an intermediate layer 64 is additionally arranged between the first reflector layer 58 and the second reflector layer 60. The intermediate layer 64 can be provided for example in order to prevent the horizontal grain boundary regions 58a, 60a of the first and second reflector layers 58, 60 from receding during subsequent thermal treatments. The materials and the layer thicknesses of the reflector layers 58, 60 illustrated in FIG. 3 and of the adhesion promoting layer 42 can substantially correspond to the materials and layer thicknesses explained in association with the previous embodiment.

The intermediate layer 64 can be a relatively thin layer. By way of example, the layer thickness of the intermediate layer can be a maximum of 10% of the layer thickness of one of the reflector layers. The layer thickness of the intermediate layer 64 can be less than or equal to 10 nm. Furthermore, the layer thickness of the intermediate layer 64 can be less than or equal to 5 nm. In some embodiments, the layer thickness of the intermediate layer 64 can be 3 nm, for example.

The intermediate layer 64 can form a continuous area or an area having local openings. While a continuous area completely covers the reflector layer, that is to say that the layer is closed, an area having local openings does not completely cover the reflector layer. By way of example, the material of the intermediate layer in the course of producing small layer thicknesses can be arranged in such a way that the intermediate layer 64 does not form in a continuous fashion. For this purpose, by way of example, the application of the material of the intermediate layer can be ended before the intermediate layer can form continuously. This can occur for example with layer thicknesses that are less than 5 nm. In this case, the material can be arranged as a multiplicity of mutually separate material accumulations. The material accumulations can be at least partly connected to one another. The material of the intermediate layer can be arranged in a randomly distributed fashion. Furthermore, the material of the intermediate layer can be intercalated between the reflector layers.

The intermediate layer 64 may include the second material and/or a third material. The third material can be for example a transparent, electrically conductive oxide or a dielectric material. A transparent, electrically conductive oxide can be provided for example if the intermediate layer forms a continuous area. A dielectric material can be provided for example if the intermediate layer is an area having local openings. Furthermore, the third material can be selected for example from a similar group to that of the second material. Accordingly, the third material may include zinc oxide, platinum, nickel, titanium, indium tin oxide, rhodium, chromium or a compound containing these materials. The intermediate layer 64 can be applied by methods of physical vapor deposition, such as sputtering or vapor deposition, for example, or by chemical vapor deposition. Furthermore, in order to produce the intermediate layer 64 during a growth pause, for example, oxygen can be introduced into the installation. As a result, an oxide layer of the first material can form at the surface of the reflector layer. Accordingly, the third material can also be an oxide of the first material.

In the case of the second layer sequence 52 illustrated in FIG. 3, the first and second reflector layers 58, 60 can be in each case silver layers. For application in the infrared wavelength range, for example, gold layers can also be provided. The reflector layers 58, 60 can have in total a thickness of less than 500 nm. The intermediate layer 64 can be a doped zinc oxide layer having a layer thickness of less than or equal to 10 nm. The dopant for the zinc oxide layer can be chosen such that the doped zinc oxide layer is electrically conductive. By way of example, the zinc oxide layer can be doped with gallium or aluminum. The adhesion promoting layer 42 illustrated can be an undoped zinc oxide layer having a layer thickness of less than or equal to 20 nm. It was able to be observed that in exemplary embodiments with an intermediate layer, the layer thickness of the adhesion promoting layer required for achieving a desired layer quality of the reflector layers can be smaller than in embodiments without an intermediate layer. Furthermore, it was able to be observed that, by introducing an intermediate layer, the layer thickness of the layer sequence can be reduced overall. By way of example, the sum of the layer thicknesses of the intermediate layer 64 and of the adhesion promoting layer 42 can be less than or equal to 20 nm.

If, in an optoelectronic component 10, the reflector layers 38, 40 are additionally also provided for electrically contacting one of the semiconductor layers 34, 36, it is generally desirable for the electrical conductivity of the reflector layers not to be adversely affected by an intermediate layer. In addition or as an alternative to the doping of a semiconducting material it is possible, in order to increase the electrical conductivity of the intermediate layer, to apply the intermediate layer in a particularly thin fashion. By way of example, in the case of intermediate layers having a layer thickness of less than 5 nm it was possible to observe that the intermediate layer, despite the use of a material having low electrical conductivity, does not or not considerably adversely affect the electrical conductivity between the first and second reflector layers. An additional doping of the material of the intermediate layer can therefore be dispensed with.

Figure 4:
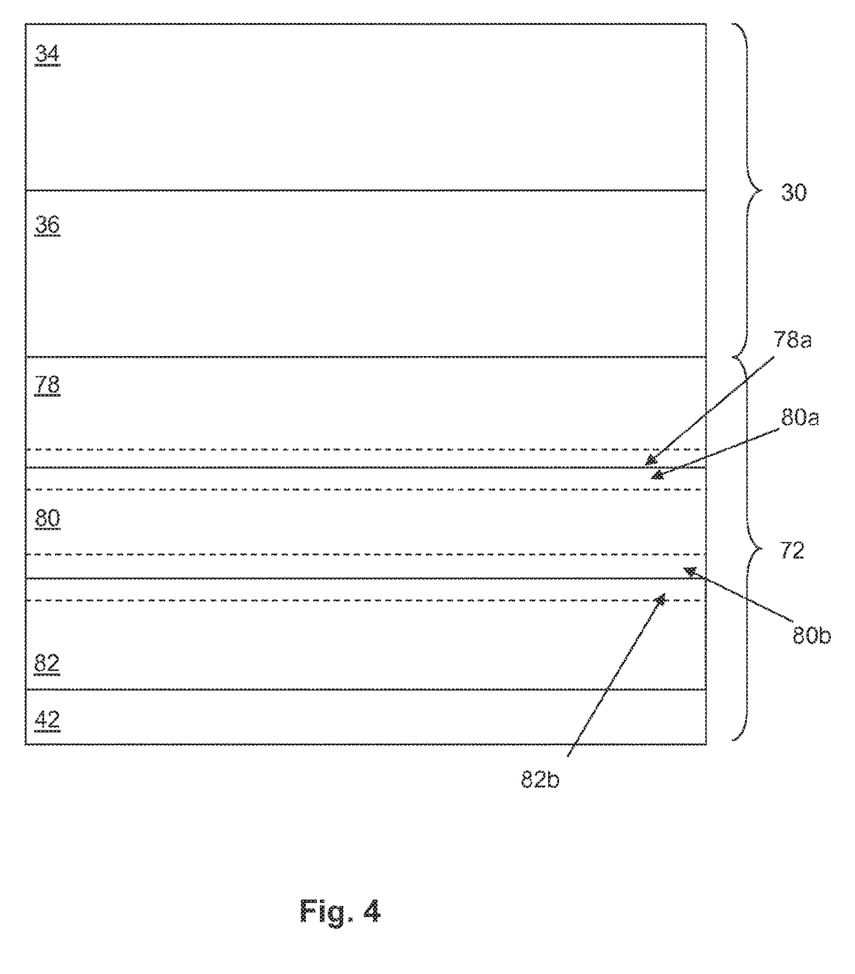
FIG. 4 shows a schematic illustration of a cross section through layer sequences in accordance with a third embodiment.

FIG. 4 is a schematic illustration of a cross section through a first and second layer sequence 30, 72 in accordance with a third embodiment. The subject matter of the third embodiment is based on the subject matter of the first embodiment, wherein a third reflector layer 82 is additionally provided. The third reflector layer 82 is arranged between the second reflector layer 80 and the adhesion promoting layer 42. The horizontal grain boundary regions 78a, 80a are arranged at the interfaces between the first and second reflector layers 78, 80. Horizontal grain boundary regions 80b, 82b are arranged at the interfaces between the second and third reflector layers 80, 82. Said grain boundary regions may substantially correspond to the grain boundary regions described in association with FIGS. 2A and 2B.

The first, second and third reflector layers 78, 80, 82 can have in total a layer thickness of less than 500 nm. The sum of the layer thicknesses of the reflector layers of the third embodiment can substantially correspond to the sum of the layer thicknesses of the reflector layers of the first and second embodiments. Accordingly, the reflector layers explained in association with the third exemplary embodiment can be thinner than the reflector layers explained in association with the first and second embodiments. Furthermore, it was possible to observe that, given otherwise comparable parameters, thinner reflector layers have fewer holes than thicker reflector layers after a heat treatment process. By way of example, it was possible to observe that a 150 nm thick reflector layer has fewer holes than a 300 nm thick reflector layer. It is therefore supposed that the dewetting of the reflector layers is dependent on the layer thicknesses of the reflector layers.

By way of example, silver can be provided as material for the first, second and third reflector layers 78, 80, 82. The material and the layer thickness of the adhesion promoting layer 42 can correspond to the material and layer thicknesses explained in association with the first and second embodiments.

Method steps similar to those provided for producing the second layer sequence 32 illustrated in FIG. 2A can be provided for producing the second layer sequence 72 illustrated in FIG. 4. In contrast to the layer sequence illustrated in FIG. 2A, two growth pauses and/or a material removal twice are provided. Furthermore, a growth pause can be provided for producing a first interface and a material removal can be provided for producing a second interface.

Figure 5:
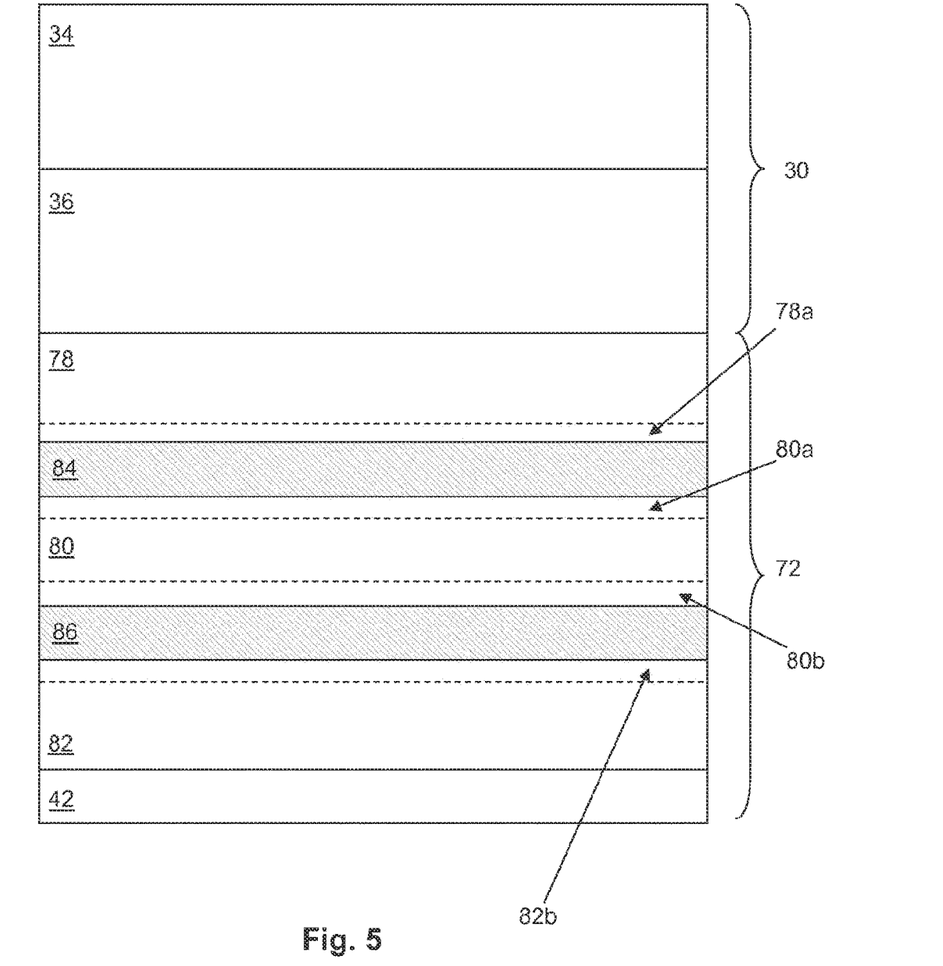
FIG. 5 shows a schematic illustration of a cross section through layer sequences in accordance with a fourth embodiment.
Figure 6:
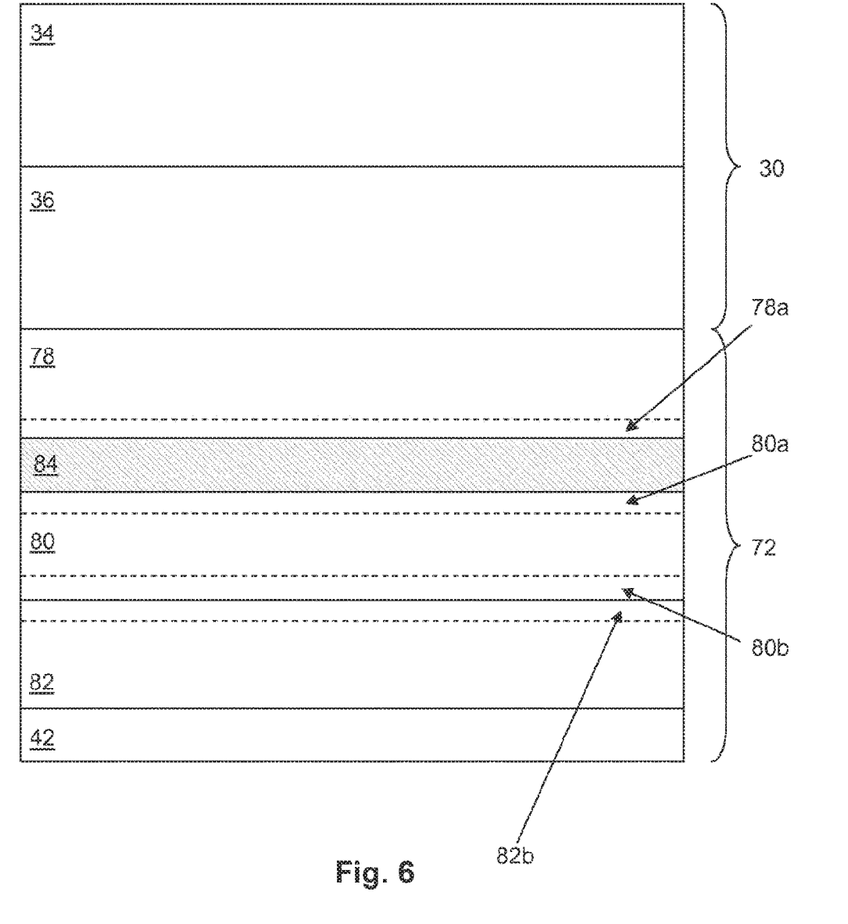
FIG. 6 shows a schematic illustration of a cross section through layer sequences in accordance with a fifth embodiment.

FIGS. 5 and 6 are schematic illustrations of cross sections of embodiments based on the third embodiment. In the case of the embodiment illustrated in FIG. 5, a first intermediate layer 84 is arranged between the first and second reflector layers 78, 80. A second intermediate layer 86 is arranged between the second and third reflector layers 80, 82. The adhesion promoting layer 42 is arranged at the third reflector layer 82. The material and the layer thickness of the adhesion promoting layer 42 can correspond to the material and layer thicknesses explained in association with the first and second embodiments. The material and the layer thicknesses of the first and second intermediate layers 84, 86 can substantially correspond to the materials and layer thicknesses disclosed in association with the second exemplary embodiment. Furthermore, in each case the same materials and layer thicknesses can be provided for the first and second intermediate layers 84, 86. However, it is also possible for different materials and layer thicknesses to be provided.

In one concrete embodiment, the first and second intermediate layers 80, 82 can have in each case a layer thickness of less than 10 nm. Furthermore, the first and second intermediate layers 80, 82 can be formed in each case from zinc oxide. The first, second and third reflector layers 78, 80, 82 can be formed in each case from silver. The reflector layers 78, 80, 82 can have a total layer thickness of approximately 300 nm. The adhesion promoting layer 42 can be formed from zinc oxide. The sum of the layer thicknesses of the first and second intermediate layers 84, 86 and of the adhesion promoting layer 42 can be less than or equal to 20 nm. The adhesion promoting layer, the first, second and third reflector layers and the intermediate layers can be produced in each case by sputtering.

In an embodiment that is not illustrated, the layer thickness of the first intermediate layer can be greater than the layer thickness of the second intermediate layer. By way of example, the layer thickness of the first intermediate layer can be approximately double the magnitude of that of the second intermediate layer. Furthermore, the layer thickness of the first reflector layer can be less than the layer thickness of the second reflector layer. By way of example, the layer thickness of the first reflector layer can be half the magnitude of that of the second reflector layer.

In the embodiment in FIG. 6, three reflector layers 78, 80, 82 and one intermediate layer 84 are provided. In this case, the intermediate layer 84 can be arranged between the first and second reflector layers 78, 80 or between the second and third reflector layers 80, 82. In the illustration in FIG. 6, the intermediate layer 84 is arranged between the first and second reflector layers 78, 80. Apart from the deviating arrangement, the layers illustrated in FIG. 6 can substantially correspond to the layers illustrated in FIG. 5.

In order to produce the embodiment illustrated in FIG. 6, by way of example, 100 nm of the first material can be applied to the first side of the first layer sequence 30 by sputtering. The first reflector layer 78 can be produced as a result. Afterward, a growth pause of at least 10 seconds, for example, can be provided. After the growth pause, 100 nm of the first material can be applied to the first reflector layer 78. The second reflector layer 80 can be produced as a result. An intermediate layer 84 can be produced after the second reflector layer has been produced. The intermediate layer can be produced for example by the targeted oxidation of the first material of the second reflector layer or by the application of a second and/or third material. After the intermediate layer 84 has been produced, 100 nm of the first material are applied to the intermediate layer 84 in order to produce the third reflector layer 82. 10 nm of the second material are then sputtered onto the third reflector layer 82 in order to produce the adhesion promoting layer 42. After the application of the individual layers of the second layer sequence, a heat treatment process is provided. A thermal storage at temperatures of between 200° C. and 300° C. for one hour can be provided for the heat treatment.

In embodiments that are not illustrated, it is also possible for more than three reflector layers to be provided. In this case, the sum of the layer thicknesses for embodiments including more than three reflector layers can also be less than 500 nm. One or a plurality of intermediate layers can also be provided in embodiments including more than three reflector layers.

The optoelectronic component and the method for producing an optoelectronic component have been described on the basis of some exemplary embodiments in order to elucidate the underlying concept. The embodiments here are not restricted to specific feature combinations. Even if some features and configurations have only been described in association with one particular exemplary embodiment or individual exemplary embodiments, they can be combined in each case with other features from other embodiments. It is likewise possible to omit or add individual presented features or particular configurations in embodiments, insofar as the general technical teaching remains realized.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component comprising:
   a first layer sequence, which is designed to emit or to detect electromagnetic radiation, and
   a second layer sequence, which is arranged at a first side of the first layer sequence and is designed to reflect the electromagnetic radiation emitted or to be detected by the first layer sequence, wherein the second layer sequence has a first reflector layer, a second reflector layer, a third reflector, an adhesion promoting layer, and an intermediate layer arranged between the first reflector layer and the second reflector layer and/or the second reflector layer and the third reflector layer where the intermediate layer comprises a thickness less than 10 nanometers (nm);
   wherein
   the first reflector layer contains a first material and is arranged at a first side of the second layer sequence facing the first side of the first layer sequence,
   the adhesion promoting layer contains a second material and is arranged at a second side of the second layer sequence facing away from the first side of the first layer sequence, and
   the second reflector layer contains the first material and is arranged between the first reflector layer and the adhesion promoting layer; and
   the third reflector layer contains the first material.

2. The optoelectronic component as claimed in claim 1, wherein the adhesion promoting layer forms a diffusion barrier.

3. The optoelectronic component as claimed in claim 1.

4. The optoelectronic component as claimed in claim 1, wherein the intermediate layer forms a continuous structure or a structure having local openings.

5. The optoelectronic component as claimed in claim 3, wherein the intermediate layer contains the second material and/or a third material.

6. The optoelectronic component as claimed in claim 5, wherein the third material is electrically conductive.

7. The optoelectronic component as claimed in claim 1, wherein the reflector layers have at least one horizontal grain boundary region.

8. The optoelectronic component as claimed in claim 1, wherein the adhesion promoting layer has a layer thickness in a range of between 5 and 100 nm.

9. A method comprising:
producing a layer sequence of an optoelectronic component, wherein the layer sequence has a first reflector layer containing a first material, a second reflector layer containing the first material, a third reflector layer containing the first material, an intermediate layer arranged between the first reflector layer and the second reflector layer and/or the second reflector layer and the third reflector layer where the intermediate layer comprises a thickness less than 10 nanometers (nm); and an adhesion promoting layer containing a second material, and wherein a horizontal grain boundary region is produced between the application of the first material for the first reflector layer and the application of the first material for the second reflector layer in one of the reflector layers.

10. The method as claimed in claim 9, wherein the horizontal grain boundary region is produced by a growth pause between the application of the first reflector layer and the application of the second reflector layer.

11. The method as claimed in claim 9, wherein the horizontal grain boundary region is produced by the application of an intermediate layer.

12. The method as claimed in claim 9, wherein between the application of the first reflector layer and the application of the second reflector layer a part of the reflector layer already applied is removed.

* * * * *